(12) United States Patent
Uchii et al.

(10) Patent No.: US 9,258,917 B2
(45) Date of Patent: Feb. 9, 2016

(54) GAS INSULATED ELECTRICAL EQUIPMENT

(71) Applicant: KABUSHIKI KAISHA TOSHIBA, Minato-ku, Tokyo (JP)

(72) Inventors: Toshiyuki Uchii, Yokohama (JP); Akira Shimamura, Yokohama (JP); Amane Majima, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 102 days.

(21) Appl. No.: 14/276,677

(22) Filed: May 13, 2014

(65) Prior Publication Data

US 2014/0247538 A1    Sep. 4, 2014

Related U.S. Application Data

(63) Continuation-in-part of application No. PCT/JP2012/005650, filed on Sep. 6, 2012.

(30) Foreign Application Priority Data

Nov. 22, 2011   (JP) .................................. 2011-255049

(51) Int. Cl.
*H02B 5/00* (2006.01)
*H05K 5/06* (2006.01)
(Continued)

(52) U.S. Cl.
CPC ................. *H05K 5/06* (2013.01); *H01H 33/56* (2013.01); *H02B 13/025* (2013.01); *H01H 2033/566* (2013.01); *H01H 2033/568* (2013.01); *H02B 5/00* (2013.01)

(58) Field of Classification Search
CPC ... H05K 5/06; H01H 33/56; H01H 2033/566; H01H 2033/568; H02B 13/025
See application file for complete search history.

(56) References Cited

U.S. PATENT DOCUMENTS 3,787,648 A * 1/1974 Kawasaki ............ H01H 33/285
                                                       218/87
4,658,108 A * 4/1987 Mauthe ................ H01H 33/901
                                                       218/66
(Continued)

FOREIGN PATENT DOCUMENTS

CN         1059994 A      4/1992
CN       102047365 A      5/2011
(Continued)

OTHER PUBLICATIONS

Chinese Office Action dated Dec. 23, 2014, issued in counterpart Chinese Application No. 201280001407.5.

(Continued)

*Primary Examiner* — Gregory Thompson
(74) *Attorney, Agent, or Firm* — Holtz, Holtz & Volek PC

(57) ABSTRACT

According to an embodiment, a gas insulated electrical equipment includes: a high-voltage conductor to be electrically charged; a hermetically sealed tank to be filled with insulating gas, one or more insulating spacers for dividing the hermetically sealed tank into gas compartments and supporting the high-voltage conductor; and a pressure release device equipped with a mouth of flow channel adapted to allow the inside and the outside of the hermetically sealed tank to communicate with each other so as to release the pressure in the hermetically sealed tank, which maintains the hermetically sealed state in an ordinary condition where the pressure in a gas compartment does not exceed the working pressure but releases the pressure in the hermetically sealed tank in an abnormal condition where the pressure in the gas compartment exceeds the working pressure.

18 Claims, 6 Drawing Sheets

(51) Int. Cl.
  *H02B 13/025*  (2006.01)
  *H01H 33/56*  (2006.01)

(56) References Cited

U.S. PATENT DOCUMENTS

| | | | | |
|---|---|---|---|---|
| 5,103,198 | A * | 4/1992 | Morel | H01H 9/50 218/149 |
| 5,761,025 | A * | 6/1998 | Iversen | H02B 1/14 200/50.27 |
| 6,859,124 | B2 * | 2/2005 | Nishimizu | H01F 27/20 336/55 |
| 7,816,618 | B2 | 10/2010 | Uchii | |
| 2001/0035395 | A1 * | 11/2001 | Dufournet | H01H 33/98 218/43 |
| 2005/0247677 | A1 * | 11/2005 | Perret | H01H 33/6661 218/140 |
| 2007/0272658 | A1 * | 11/2007 | Heiermeier | H01H 33/901 218/59 |
| 2011/0127237 | A1 | 6/2011 | Uchii et al. | |

FOREIGN PATENT DOCUMENTS

| | | |
|---|---|---|
| DE | 2739030 A1 | 3/1979 |
| FR | 2944134 A1 | 10/2010 |
| JP | 02-007817 A | 1/1990 |
| JP | 04-133606 A | 5/1992 |
| JP | 09-275609 A | 10/1997 |
| JP | 2003-142318 A | 5/2003 |

OTHER PUBLICATIONS

International Search Report (ISR) dated Oct. 2, 2012 (and English translation thereof) issued in International Application No. PCT/JP2012/005650.

International Preliminary Report on Patentability (IPRP) including Written Opinion dated Jun. 5, 2014 in parent International Application No. PCT/JP2012/005650.

Extended European Search Report dated Jul. 14, 2015, issued in counterpart European Application No. 12850866.0.

* cited by examiner

US 9,258,917 B2

GAS INSULATED ELECTRICAL EQUIPMENT

CROSS REFERENCES TO RELATED APPLICATIONS

This application is a continuation-in-part (CIP) application based upon the International Application PCT/JP2012/005650, the International Filing Date of which is Sep. 6, 2012, the entire content of which is incorporated herein by reference, and is based upon and claims the benefits of priority from the prior Japanese Patent Application No. 2011-255049, filed in the Japanese Patent Office on Nov. 22, 2011, the entire content of which is incorporated herein by reference.

FIELD

Embodiments described herein relate to a gas insulated electrical equipment.

BACKGROUND

Various devices (to be collectively referred to as gas insulated electrical equipment hereinafter) including gas insulated switchgears, gas circuit breakers, gas disconnecting switches, gas insulated transformers and gas insulated transmission lines that utilize sulfur hexafluoride gas (to be expressed as $SF_6$ gas hereinafter) as insulation medium for high-voltage insulation are being employed in power transmission/distribution and transformation systems. $SF_6$ gas is employed not only as insulation medium for high-voltage insulation but also as cooling medium for cooling various parts being heated by electricity by way of convection thereof and also as arc extinguishing medium for extinguishing arc discharges that can take place during switching operations of such devices as gas circuit breakers and gas disconnecting switches that involve electric current switching operations.

$SF_6$ gas is a very stable inert gas. It is a gas that is non-toxic and non-inflammable and, at the same time, shows excellent electrical insulation performances and discharge extinguishing performances (to be referred to as arc extinguishing performance hereinafter). Thus, it has been and still is greatly contributing to realization of high performance and compact gas insulated devices for handling electric power to be used in power transmission/distribution and transmission equipment.

While $SF_6$ gas is very suited for use in gas insulated electrical equipment, it is also known that $SF_6$ gas has a strong global warming effect and hence the amount of use of $SF_6$ gas has been desired to be reduced in recent years. The extent of global warming effect of a substance is generally indicated by a global warming potential, which is the ratio to the potential of $CO_2$ gas that is equal to 1. It is known that the global warming potential of $SF_6$ gas is as large as 23,900. For this reason, the use of gases other than $SF_6$ that is a man made gas having a very large global warming potential has been proposed for use in gas insulated electrical equipment.

More specifically, the use of $N_2$ gas, $CO_2$ gas and mixture gases containing either of them as main components has been discussed and studied. $N_2$ gas and $CO_2$ gas are gases existing in nature and friendly to the environment. Since their global warming effects are very small and not greater than one 23,900th of that of $SF_6$ gas, the influences of the use of insulation gases on global warming can significantly be suppressed by using $N_2$ gas and $CO_2$ gas instead of $SF_6$ gas in gas insulated electrical equipment. While the insulation performance and the arc extinguishing performance of $N_2$ gas and those of $CO_2$ gas are inferior to those of $SF_6$ gas, studies are being made to enhance the performances of those substitute gases by using higher filling pressure and improving the structures of devices using such gases. In other words, it is possible to provide gas insulated electrical equipment that generally shows excellent performances and is friendly to the environment and less global warming by using $N_2$ gas and $CO_2$ gas instead of $SF_6$ gas.

While gas insulated electrical equipment is in operation, an arc (to be referred to as internal arc hereinafter) can take place in a hermetically sealed tank that contains the equipment. Once the internal arc occurs, excessive short-circuit currents flow there so that the pressure in the gas compartment in the hermetically sealed tank rapidly rises due to the large amount of heat generated by the short-circuit currents.

When the hermetically sealed tank is ruptured under such high pressure, it is very hazardous to the environment. For this reason, there are instances where a hermetically sealed tank is provided with a pressure release device for releasing the internal pressure of the hermetically sealed tank when the internal pressure abnormally rises. However, as pointed out above, $SF_6$ gas that is being popularly employed at present is a substance that adversely affects the environment after discharged to the atmosphere and it is known that $SF_6$ gas produces toxic decomposition products when $SF_6$ gas is dissociated by the high temperature produced by the internal arc. Thus, hermetically sealed tanks and insulating spacers to be used therein are more often than not designed to show a considerably high mechanical strength in order to withstand the pressure produced by the internal arc in gas compartments and prevent gas from being released to the outside of hermetically sealed tanks even when the internal arc occurs in the inside of the tanks. Such efforts are desirable from the viewpoint of protecting the environment.

BRIEF DESCRIPTION OF THE DRAWINGS

The above and other features and advantages of the present invention will become apparent from the discussion hereinbelow of specific, illustrative embodiments thereof presented in conjunction with the accompanying drawings, in which.

DETAILED DESCRIPTION

Figure 1:
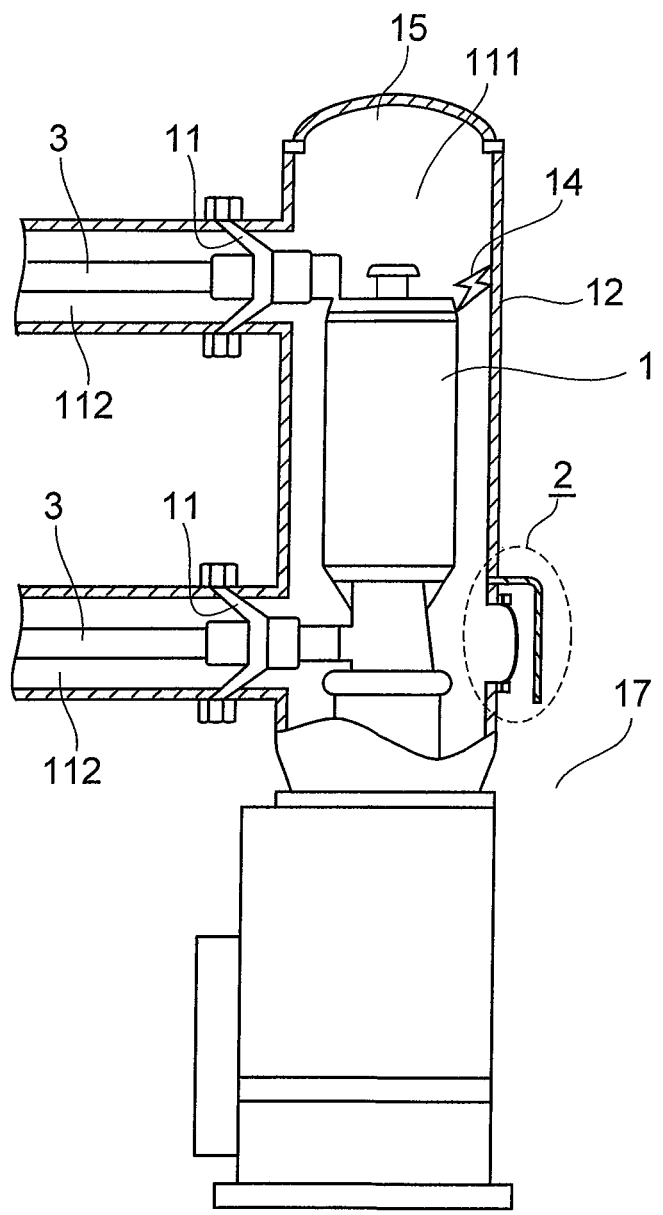
FIG. 1 is a schematic longitudinal cross-sectional view of a gas insulated electrical equipment according to the first embodiment of the present invention.

The embodiments described here have been made to solve the above problem, and an object thereof is to provide gas insulated electrical equipment that is very friendly to the environment, highly safe and economically remarkably advantageous.

According to one embodiment, a gas insulated electrical equipment including: a high-voltage conductor to be electrically charged; a hermetically sealed container to be filled with insulating gas; one or more insulating spacers for dividing the hermetically sealed container into a plurality of gas compartments and supporting the high-voltage conductor, keeping insulation between the high-voltage conductor and the hermetically sealed container; and a pressure release device equipped with a mouth of flow channel adapted to allow the inside and the outside of the hermetically sealed container to communicate with each other so as to hermetically seal the hermetically sealed container by closing the mouth of flow channel and release the pressure in the hermetically sealed container by opening the mouth of flow channel, wherein provided that the minimum flow channel cross-sectional area that is the area of the cross section that is perpendicular to the flow direction of the insulating gas in the mouth of flow channel is SD, the working pressure at which the pressure release device starts operating is Pop, and with regard to the arc that occurs in the inside of the hermetically sealed container, the average effective value of the arc current that is an estimation value is Ia and the arc ignition time that is also an estimation value is Ta, while the volume of the gas compartment that can be a target of occurrence of an arc is VT and the withstanding pressure of the insulating spacer is PD and the constant indicating the efficiency of arc energy that contributes to the rise of pressure is α, the first constant and the second constant that respectively define the pressure rising characteristics of the insulating gas and the pressure release characteristics of the insulating gas being Kga and Kgb and that the equation of $Kc = Kga \times Ia^{\alpha}/VT$ is made to hold true; SD is found within the range satisfying the requirements of conditional formula of $SD > VT/\{Kgb \times \log((Kc \times Ta - Pop)/(Kc \times Ta - PD))\}$; and the pressure release device is so designed as to hermetically seal the hermetically sealed container and maintain the hermetically sealed state in an ordinary condition where the pressure in the gas compartment that can be a target of occurrence of an arc does not exceed the working pressure but release the pressure in the hermetically sealed container in an abnormal condition where the pressure in the gas compartment that can be a target of occurrence of an arc exceeds the working pressure.

Now, a gas insulated electrical equipment according to the embodiments of the present invention will be described in greater detail by referring to the drawings. Note that, throughout the drawings, the parts that are same or similar to each other are denoted by the same reference symbols and will not be described repeatedly. All the embodiments of a gas insulated electrical equipment are described below in terms of gas circuit breaker.

First Embodiment

FIG. 1 is a schematic longitudinal cross-sectional view of a gas insulated electrical equipment according to the first embodiment of the present invention.

As shown in FIG. 1, the gas insulated electrical equipment includes a gas circuit breaker 1, a pressure release device 2, high-voltage conductors 3, a hermetically sealed tank 12 and insulating spacers 11. Note that FIG. 1 shows a state where an arc 14 has taken place in the hermetically sealed tank 12.

The gas circuit breaker 1 is a circuit breaker using insulating gas 15 as medium. The high-voltage conductor 3 is an electric conductor to be supplied with power that is typically adapted to connect conductors in the main current carrying part and/or different devices.

The hermetically sealed tank 12 is filled with insulating gas 15. The hermetically sealed tank 12 is typically a tank formed by welding rolled metal plates. In the gas insulated electrical equipment, the filled insulating gas 15 takes a role of insulator between the high-voltage conductor 3 and the hermetically sealed tank 12 or the parts that give rise to a potential difference between the high-voltage conductor 3 and themselves.

The insulating spacers 11 are arranged to partition the inside of the hermetically sealed tank 12 into a plurality of gas compartments and supports the high-voltage conductor 3, maintaining the insulation between the high-voltage conductor 3 and the hermetically sealed tank 12.

In FIG. 1, the gas compartment where an arc 14 has occurred is referred to as target gas compartment 111 and the gas compartments neighboring the target gas compartment 111 are referred to as neighboring gas compartments 112. An insulating spacer 11 is arranged between the target gas compartment 111 and each of the neighboring gas compartments 112. The arc 14 typically occurs between the hermetically sealed tank 12 and the gas circuit breaker 1.

The pressure release device 2 is provided with a mouth of flow channel 21 (shown in FIG. 2) that allows the inside (the target gas compartment 111) and the outside (atmosphere 17) of the hermetically sealed tank 12 to communicate with each other. The hermetically sealed tank 12 is literally hermetically sealed when the mouth of flow channel 21 is closed, whereas the pressure in the inside of the hermetically sealed tank 12 is released when the mouth of flow channel 21 is opened. The mouth of the flow channel 21 will be described in greater detail hereinafter.

Figure 2:
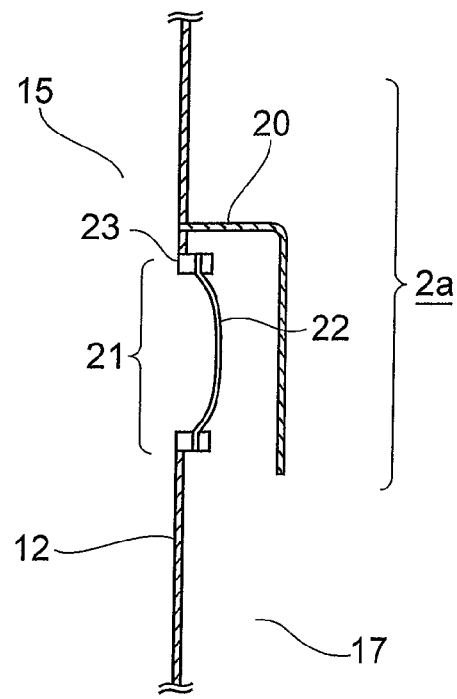
FIG. 2 is an enlarged longitudinal cross-sectional view of the pressure release device of the first embodiment in an ordinary condition.
Figure 3:
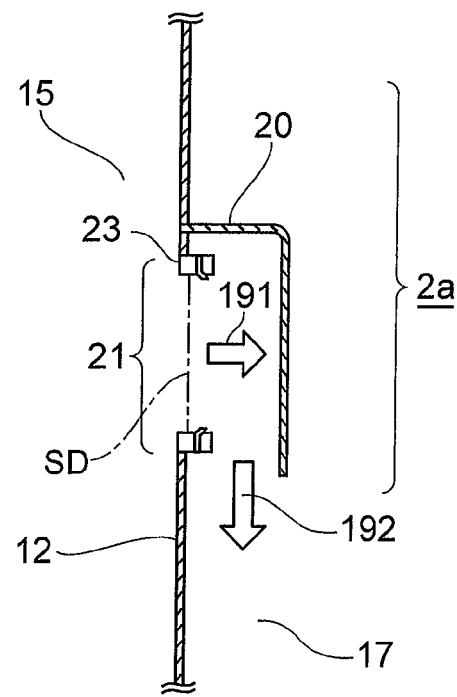
FIG. 3 is an enlarged longitudinal cross-sectional view of the pressure release device of the first embodiment in an abnormal condition.

FIGS. 2 and 3 are enlarged longitudinal cross-sectional view of the pressure release device 2 (2a). FIG. 2 is an enlarged longitudinal cross-sectional view of the pressure release device 2a in an ordinary condition before the device 2a falls into an abnormal condition, and FIG. 3 is an enlarged longitudinal cross-sectional view of the pressure release device 2a in an abnormal condition.

The pressure release device 2a shown in FIGS. 2 and 3 has a protection cover 20, the mouth of flow channel 21, a rupture disk 22, and a disc holder 23. As shown in FIGS. 2 and 3, the pressure release device 2a is fitted to the hermetically sealed tank 12.

The mouth of flow channel 21 is formed so as to allow the inside and the outside (atmosphere 17) of the hermetically sealed tank 12 to communicate with each other. When a pressure release operation is executed by the pressure release device 2 (2a), the mouth of flow channel 21 operates as release port for releasing the insulating gas 15 into the atmosphere 17.

The rupture disk 22 covers the mouth of flow channel 21 that allows the inside and the outside of the hermetically sealed tank 12 to communicate with each other. The rupture disk 22 is fitted to the hermetically sealed tank 12 by means of the holder 23. The rupture disk 22 is formed so as to show withstanding pressure (permissible pressure) less than the insulating spacers 11 that are arranged at the target gas compartment 111 of the arc 14 and strength that makes the disk to be ruptured in an abnormal condition.

The expression of ordinary condition as used herein refers to a condition where the pressure in the target gas compartment 111 in which the arc 14 can occur does not exceed the working pressure of the pressure release device 2. On the other hand, the expression of abnormal condition as used herein refers to a condition where the pressure in the target gas compartment 111 exceeds the working pressure of the pressure release device 2. The working pressure of the pressure release device 2a shown in FIG. 2 is higher than the withstanding pressure of the rupture disk 22.

In the ordinary condition, the rupture disk 22 keeps the hermetically sealed tank 12 literally in a hermetically sealed condition. As the ordinary condition turns into the abnormal condition, the rupture disk 22 ruptures. As a result, the insulating gas 15 is released from the inside of the hermetically sealed tank 12 to the outside (atmosphere 17) by way of the mouth of flow channel 21 and the internal pressure of the hermetically sealed tank 12 is released so as to fall to near the atmospheric pressure.

In the abnormal condition as defined above, the rupture disk 22 of the pressure release device 2a ruptures as shown in FIG. 3 to produce a flow channel having a minimum flow channel cross-sectional area SD at the mouth of flow channel 21. The insulating gas 15 bursts out in the direction of arrow 191 from the inside to the outside of the hermetically sealed tank 12, passing through this flow channel. The insulating gas 15 that bursts out in the direction of arrow 191 is forced to change its flowing direction by the protection cover 20 in the direction of arrow 192 that is directed to the open end of the protection cover 20. The rupture disk 22 is replaceable and, when the rupture disk 22 ruptures, a substitute rupture disk 22 is fitted to the holder 23 for replacement. A desired direction is determined for the direction of arrow 192 by considering the conditions of the installation environment and the servicing environment of the equipment and the fitting position and direction of the protection cover 20 can be modified for the pressure release device 2 depending on these conditions.

With the first embodiment, the pressure of the target gas compartment 111 of the hermetically sealed tank 12 can be suppressed to below the withstanding pressure PD even when the internal arc occurs by confining the working pressure Pop and the minimum flow channel cross-sectional area SD of the pressure release device 2 to within the range defined by the formula shown below Formula 1.

When the minimum flow channel cross-sectional area of the mouth of flow channel 21 of the pressure release device 2 is expressed by SD, it is confined to within the range expressed by the formula shown below Formula 1. When the rupture disk 22 is turned into a ruptured state from a state of closing the mouth of flow channel 21, the minimum flow channel cross-sectional area SD is the area of the smallest cross section that is perpendicular to the flow direction of the insulating gas 15 in the mouth of flow channel 21 as shown in FIG. 3.

The working pressure that is observed when the pressure release device 2 starts releasing the insulating gas is expressed by Pop (Pa). With regard to the arc 14 (internal arc) that occurs in the hermetically sealed tank 12 (hermetically sealed container) in the first embodiment, the average effective value of the arc current that is an estimation value is expressed by Ia(kA) and the arc ignition time that is also an estimation value is expressed by Ta(ms), while the volume of the target gas compartment 111 is expressed by VT($m^3$). The withstanding pressure of the insulating spacers 11 is expressed as PD(Pa) and the constant indicating the efficiency of arc energy that contributes to the rise of internal pressure is expressed by α, while the first constant and the second constant that respectively define the pressure rising characteristics of the insulating gas 15 and the pressure release characteristics of the insulating gas 15 are expressed as Kga and Kgb and the equation of Kc=Kga×$Ia^α$/VT is made to hold true. Then, the minimum flow channel cross-sectional area SD and the working pressure Pop of the pressure release device 2 are so selected as to satisfy the requirements of the conditional formula, or Formula 1 shown below:

$$SD > VT/Kgb/\log((Kc \times Ta - Pop)/(Kc \times Ta - PD))$$  (Formula 1).

The design of the gas insulated electrical equipment of the first embodiment that satisfies the requirements of the Formula 1 will be described below.

Figure 4:
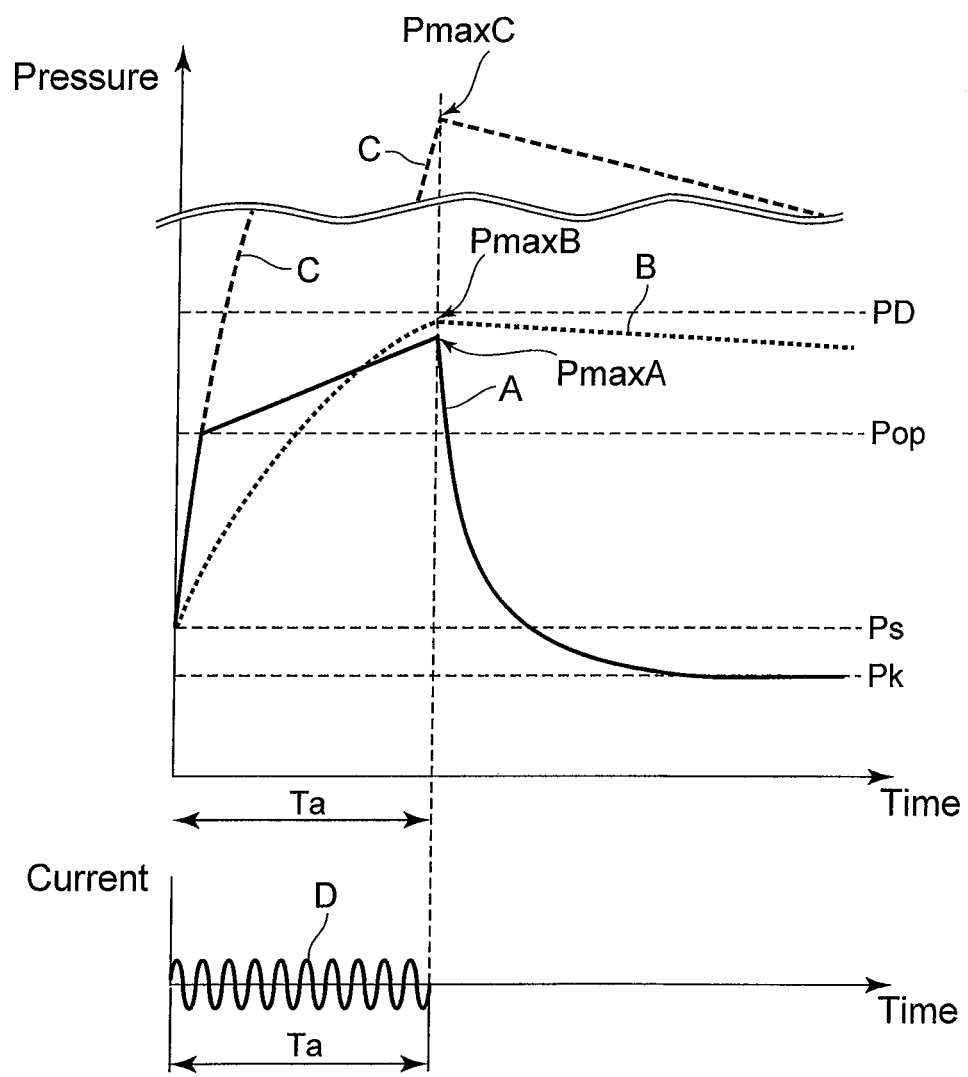
FIG. 4 is a graph illustrating the pressure change in a hermetically sealed tank when an internal arc occurs.

FIG. 4 is a graph illustrating the pressure change in the hermetically sealed tank 12 when an internal arc occurs. Particularly in the graph part shown in an upper part of FIG. 4, the horizontal axis indicates time and the longitudinal axis indicates pressure. FIG. 4 shows the pressure characteristics of different insulating gases 15 in the target gas compartment 111 that are made observable by the internal arc. In the graph part shown in a lower part of FIG. 4, the horizontal axis indicates time and the longitudinal axis indicates current. FIG. 4 shows the current characteristics of the internal arc that corresponds to the time period same as the upper part of the graph. Now, the pressure change that is observable in the hermetically sealed tank 12 when the internal arc occurs will be described below by referring to FIG. 4.

Assume that the insulating gas 15 in the gas insulated electrical equipment of the first embodiment as shown in FIG. 1 includes $CO_2$ gas and $N_2$ gas and the internal arc (arc 14 as shown in FIG. 1) occurs in the hermetically sealed tank 12. Once the internal arc occurs, the pressure in the inside of the hermetically sealed tank 12 rises. Also assume that the pressure characteristics and the current characteristics of the internal arc in this instance are expressed respectively by waveform A and waveform D in FIG. 4.

Waveform B in FIG. 4 is shown for the purpose of comparison with the waveform A. Such a waveform shows an exemplar pressure characteristics that can be observed when the internal arc occurs in a hermetically sealed tank that has a volume same as the volume of the hermetically sealed tank 12 shown in FIG. 1 and contains insulating gas 15 that is $SF_6$ gas but is not equipped with a pressure release device 2.

Likewise, waveform C in FIG. 4 is shown for the purpose of comparison with the waveform A. Such a waveform shows an exemplar pressure characteristics that can be observed when the internal arc occurs in a hermetically sealed tank that has a volume same as the volume of the hermetically sealed tank 12 shown in FIG. 1 and contains insulating gas 15 that includes $CO_2$ gas and $N_2$ gas but is not equipped with a pressure release device 2. It is also assumed here that the internal arcs commonly have same arc continuation time Ta indicated by the waveform D. In FIG. 4, PD denotes the withstanding pressure of the insulating spacers and Pop denotes the working pressure of the pressure release device 2, while Ps denotes the rated pressure (which corresponds to the pressure in an ordinary condition) of the hermetically sealed tank 12 and Pk denotes the atmosphere pressure.

In the case of the above-described gas insulated electrical equipment that is not equipped with the pressure release device 2 and contains $SF_6$ gas as insulating gas 15, the pressure rising characteristics after the occurrence of the internal arc is such that the pressure rises to the maximum pressure PmaxB that does not exceeds the withstanding pressure PD and thereafter gradually falls as indicated by the waveform B in FIG. 4.

In the case of the above-described gas insulated electrical equipment that is not equipped with the pressure release device 2 and contains $CO_2$ gas and $N_2$ gas as insulating gas 15, the pressure rises more when compared with $SF_6$ gas as indicated by the waveform C in FIG. 4. More specifically, when compared with $SF_6$ gas, the pressure of these gases in the hermetically sealed tank 12 rises more sharply to a higher pressure level (to the maximum pressure PmaxC). As a result, the maximum pressure in the hermetically sealed tank 12 of the gas insulated electrical equipment whose problem needs to be solved by the present invention as pointed out above can rises above the withstanding pressure PD to consequently break the hermetically sealed tank 12 and damage the environment and also the safety and the economic feasibility of the equipment.

As described above, the pressure rising characteristics and the pressure release characteristics vary significantly depending on the kind of insulating gas, the configuration of equipment and the conditions of internal arc. Therefore, the above-described problems arise when a gas insulated electrical equipment designed to be operated with $SF_6$ gas is simply applied to the use of $N_2$ gas, $CO_2$ gas and/or some other gas.

On the other hand, the range of working pressure Pop and that of the minimum flow channel cross-sectional area SD of the first embodiment of the gas insulated electrical equipment are properly defined so as to satisfy the requirements of the above formula (Formula 1) and hence the pressure rise in the abnormal condition in the hermetically sealed tank 12 thereof can be suppressed so as not to exceed the withstanding pressure PD. In other words, the maximum pressure PmaxA does not exceed the withstanding pressure PD of the insulating spacers when the pressure abruptly rises from the rated pressure Ps after the occurrence of the internal arc.

Then, as a result, with the first embodiment, while the pressure in the target gas compartment 111 of the hermetically sealed tank 12 sharply rises at the time of occurrence of the internal arc when $N_2$ gas, $CO_2$ gas and/or some other gas are used as insulating gas 15, the pressure release device 2 starts operating as soon as the pressure rises above the working pressure Pop to rapidly reduce the pressure in the target gas compartment 111 and suppress the pressure to the maximum pressure PmaxA that is not above the withstanding pressure PD.

More specifically, with the pressure release device 2a shown in FIGS. 2 and 3, the rupture disk 22 ruptures in an abnormal condition where the pressure in the target gas compartment 111 exceeds the working pressure Pop. Then, as a result, the target gas compartment 111 of the hermetically sealed tank 12 communicates with the atmosphere 17 by way of the minimum flow channel cross-sectional area SD of the mouth of flow channel 21. Thus, after the pressure release device 2a starts operating to release pressure, the rate of pressure rise in the target gas compartment 111 is reduced as indicated by the waveform A in FIG. 4 while the internal arc in the target gas compartment 111 continues for time Ta. After the elapse of time Ta, the internal arc is extinguished and the pressure in the target gas compartment 111 falls with time to near the atmospheric pressure Pk. In this way, when $N_2$ gas, $CO_2$ gas and/or some other gas are used as insulating gas 15, a situation where the pressure in the target gas compartment 111 of the hermetically sealed tank 12 exceeds the withstanding pressure PD can effectively be avoided to secure the safety of the first embodiment of a gas insulated electrical equipment.

Now, the grounds of the use of Formula 1 will be described below. The pressure rising characteristics in the hermetically sealed tank 12 and the pressure release characteristics of the pressure release device 2 that are observed when the internal arc occurs in the hermetically sealed tank 12 can be computationally determined when all the related physical constants and all the related boundary conditions are accurately known. In reality, however, it is difficult to accurately know all such constants and conditions. When a theoretical formula is led out as a function, it will be a very complex function that is hardly usable for engineering applications. For this reason, an empirical formula that includes empirical coefficients is devised on the basis of theoretical formulas in order to determine the maximum pressure Pmax in the target gas compartment 111 of the hermetically sealed tank 12 after the elapse of the arc ignition time Ta of the internal arc.

When $Kc=Kga \times Ia^\alpha/VT$ is made to hold true, $$P\text{max}=P\text{op}+(Kc \times Ta-P\text{op}) \times \{1-e^{-(VT/Kgb/SD)}\} \quad \text{(Formula 2)}.$$

Note that the variables and the units in the formula of Formula 2 are same as those described for Formula 1. Now, the validity of Formula 2 as empirical formula will be described below.

Figure 5:
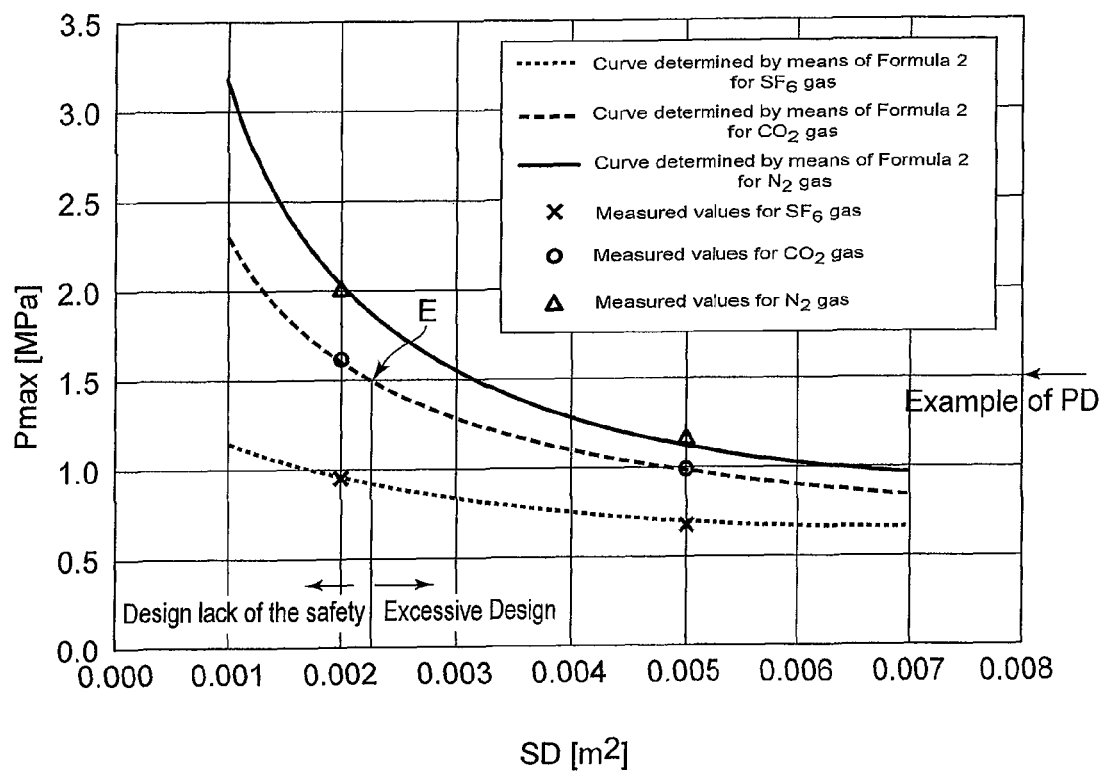
FIG. 5 is a graph illustrating an exemplar relationship between the minimum flow channel cross-sectional area and the maximum pressure in the target gas compartment.

FIG. 5 is a graph illustrating an exemplar relationship between the minimum flow channel cross-sectional area SD and the maximum pressure in the target gas compartment 111. More specifically, in FIG. 5, the longitudinal axis indicates the maximum pressure Pmax (MPa) and the horizontal axis indicates the minimum flow channel cross-sectional area $SD(m^2)$. FIG. 5 shows the approximate values of the relationship between Pmax and SD of each of several kinds of filling gas as obtained by means of Formula 2 and the corresponding measured values, under the condition of the effective value intended arc Ia=50 kA, as an example. Note that FIG. 5 shows the curves determined by means of Formula 2 and the measured values for each of several kinds of filling gas including $SF_6$ gas, $CO_2$ gas and $N_2$ gas.

In Formula 2, each of the different gases is specified by the two constants of Kga and Kgb. For example, when $N_2$ gas is employed as main component, Kga and Kgb are 14.2 and 600 respectively. When $CO_2$ gas is employed as main component, Kga and Kgb are 7.70 and 400 respectively. As shown in FIG. 5, the values determined by means of Formula 2 are very close to the respective measured values. Therefore, the maximum pressure Pmax can be obtained with ease by means of the simple expression of Formula 2 regardless what filling gas is selected for use.

Thus, with the first embodiment of the gas insulated electrical equipment, the minimum flow channel cross-sectional area SD can be properly determined to make the maximum pressure Pmax in the hermetically sealed tank 12 not exceed the withstanding pressure PD. For example, when design E in FIG. 5 is selected to use $CO_2$ gas as filling gas and 1.5 MPa as withstanding pressure PD, the minimum flow channel cross-sectional area SD needs to be roughly not less than 0.0022 $m^2$ for design E in FIG. 5. In other words, the design will be short of safety when the minimum flow channel cross-sectional area SD is smaller than the above value.

When, on the other hand, a value significantly greater than 0.0022 $m^2$ is selected for the minimum flow channel cross-sectional area SD, the structural cost for keeping the container in a hermetically sealed condition rises. Therefore, the value of the minimum flow channel cross-sectional area SD needs to be properly determined by considering both safety and economy. Formula 1 defines the range of the minimum flow channel cross-sectional area SD that can secure safety. Formula 1 can be led out by applying the condition of PD>Pmax to Formula 2.

Thus, when $CO_2$ gas, $N_2$ gas or a mixture gas containing either of them as main components is employed as insulating gas 15, the value of the minimum flow channel cross-sectional area SD can be properly determined by using Formula 1. Therefore, it is possible to make the maximum pressure PmaxA not exceed the withstanding pressure PD as in the case of the waveform A shown in FIG. 4. Then, as a result, both safety and economy of the gas insulated electrical equipment can be achieved with ease.

As described above, the working pressure Pop that triggers the pressure release operation of the pressure release device 2 can be determined on the basis of the minimum flow channel cross-sectional area SD. Conversely, the minimum flow channel cross-sectional area SD can be determined on the basis of the working pressure Pop. Alternatively, these two values can be determined by adjustment between them. Then, the pressure release device 2 releases the pressure in the hermetically sealed tank 12 when the pressure in the gas compartment (target gas compartment 111) where an arc occurs exceeds the working pressure Pop. On the other hand, the hermetically sealed tank 12 is held to a hermetically sealed condition so long as the pressure in the target gas compartment 111 does not exceed the working pressure Pop.

Thus, the first embodiment can avoid the gas that bursts out at high temperature under high pressure from getting to be hazardous to the environment because the bursting out gas can be directed to a safe direction by means of the protection cover 20. Additionally, the protection cover 20 can ensure safety against scattering debris of the rupture disk 22 at the time of releasing pressure. As a result, the pressure release device 2 can release the insulating gas 15 safely into the atmosphere 17 in the abnormal condition of a pressure rise after the internal arc occurs.

$N_2$ gas, $CO_2$ gas or gas containing $N_2$ gas or $CO_2$ gas as main component (e.g., gas containing $N_2$ gas or $CO_2$ gas by not less than 50% in terms of pressure ratio) can be used as insulating gas 15 to replace $SF_6$ gas for the first embodiment in consideration of safety design. $CO_2$ gas that is treated and collected somehow may be utilized as insulating gas 15 to be filled in the hermetically sealed tank 12. Such an arrangement can be very friendly to the environment. Thus, it is now possible to provide a gas insulated electrical equipment that is very friendly to the environment and performs excellently by using such gas.

Additionally, since the gas insulated electrical equipment according to the first embodiment employs $N_2$ gas, $CO_2$ gas or some other gas as insulating gas 15, the equipment does not produce any hazardous decomposition products When the internal arc occurs unlike conventional equipment that employs $SF_6$ gas. Additionally, since safety measures are taken against the gas bursting out at the time of releasing pressure and scattering debris of the rupture disk 22, the pressure release device 2 can safely release the insulating gas 15 into the atmosphere 17 in the abnormal condition of a pressure rise.

The hermetically sealed tank 12 is preferably not manufactured by metal casting but by welding rolled plates. Then, the risk that the entire tank explodes and explosion debris thereof scatter around is reduced to further enhance the safety of the tank When the hermetically sealed tank 12 is locally heated by the internal arc and/or the gas pressure in the hermetically sealed tank 12 excessively rises to get to an abnormal pressure level.

As described above, the first embodiment makes it possible to provide gas insulated electrical equipment that is very friendly to the environment, highly safe and economically advantageous.

Second Embodiment

Figure 6:
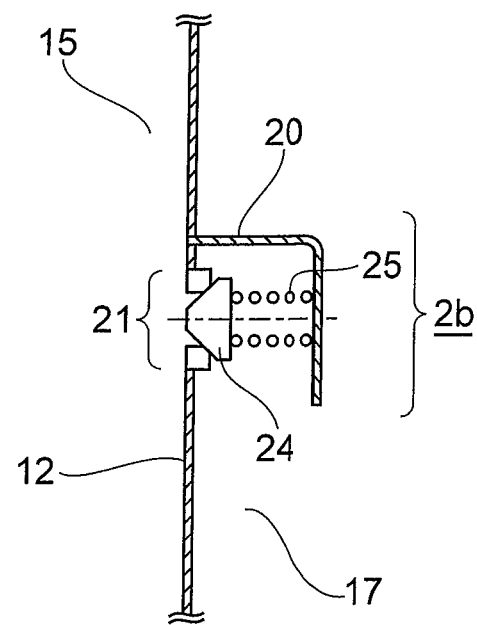
FIG. 6 is an enlarged longitudinal cross-sectional view of the pressure release device of the second embodiment in an ordinary condition.
Figure 7:
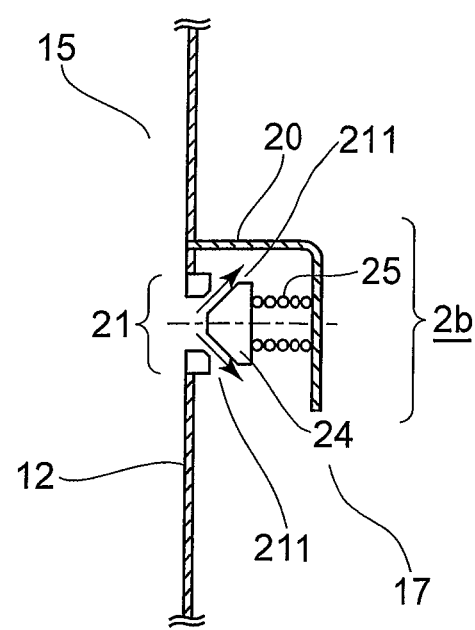
FIG. 7 is an enlarged longitudinal cross-sectional view of the pressure release device of the second embodiment in an abnormal condition.

FIGS. 6 and 7 are enlarged longitudinal cross-sectional views of the pressure release device 2b of the second embodiment. More specifically, FIG. 6 is an enlarged longitudinal cross-sectional view of the pressure release device 2b in an ordinary condition and FIG. 7 is an enlarged longitudinal cross-sectional view of the pressure release device 2b in an abnormal condition. The differences between the first embodiment and the second embodiment will be described below.

The basic configuration (not shown) of a gas insulated electrical equipment of the second embodiment is same as that of the first embodiment except that the pressure release device 2b of the second embodiment differs from the pressure release device 2a of the first embodiment. The pressure release device 2b has a protection cover 20, a mouth of flow channel 21, a valve body 24 and a spring 25. The pressure release device 2b has a structure where the spring 25 urges the valve body 24 as shown in FIGS. 6 and 7.

The valve body 24 has a valve structure for closing and opening the mouth of flow channel 21 and is movable from the inside or the outside of the hermetically sealed tank 12. The valve body 24 is formed to have such a shape that can close the mouth of flow channel 21. While FIGS. 6 and 7 show an exemplar structure where the valve body 24 can close and open the mouth of flow channel 21 from the outside of the hermetically sealed tank 12, it may alternatively be so arranged that the valve body 24 can close and open the mouth of flow channel 21 from the inside.

The spring 25 is fitted at an end thereof to the valve body 24 so as to urge the valve body 24 and rigidly fitted at the other end to a support member. For example, the protection cover 20 may be used as support member as shown in FIGS. 6 and 7 or a support member other than the protection cover 20 may be provided.

More specifically, the valve body 24 that is structurally made integral with the spring 25 closes the mouth of flow channel 21 to hermetically seal the hermetically sealed tank 12 in the ordinary condition, while it opens the mouth of flow channel 21 to release the pressure in the hermetically sealed tank 12 in the abnormal condition as will be described in greater detail hereinafter.

As shown in FIG. 6, in the ordinary condition where the pressure in the target gas compartment 111 of the hermetically sealed tank 12 does not exceed the working pressure Pop, the valve body 24 closes the mouth of flow channel 21 by the resilience of the spring 25 that urges the valve body 24 to close the mouth of flow channel 21.

As shown in FIG. 7, in the abnormal condition where the pressure in the target gas compartment 111 of the hermetically sealed tank 12 exceeds the working pressure Pop, the spring 25 that urges the valve body 24 is displaced to open the mouth of flow channel 21. Then, the valve body 24 holds the mouth of flow channel 21 open in a state where the resilience of the spring 25 is equilibrated with the pressure. Then, as a result, a gap 211 is produced between the valve body 24 and the mouth of flow channel 21 at the outside of the mouth of flow channel 21. The inside and the outside of the hermetically sealed tank 12 now communicate with each other by way of the gap 211 so that the insulating gas 15 is released into the atmosphere 17. In other words, the pressure in the hermetically sealed tank 12 is released by the pressure release device 2b.

In the instance shown in FIG. 7, assume that the minimum flow channel cross-sectional area of the mouth of flow channel 21 at the gap 211 is $SV(m^2)$. Note that the minimum flow channel cross-sectional area SV is defined by the formula obtained by replacing SD with SV in the above-described Formula 1. The minimum flow channel cross-sectional area SV at the gap 211 is the area of the smallest cross section that is perpendicular to the flowing out directions (the directions of arrows in FIG. 7) of the insulating gas 15 at the mouth of flow channel 21. The insulating gas 15 is released from the inside to the outside of the hermetically sealed tank 12 by way of the gap 211.

The protection cover 20 is fitted to the hermetically sealed tank 12 in order to avoid the gas bursting out from the mouth of flow channel 21 from flying away in particular directions. Some of the directions in which the gas bursts out are changed by the protection cover 20. Thus, as a result of fitting the protection cover 20 to the hermetically sealed tank 12, a situation where the gas bursts out into areas that otherwise give rise to a problem is prevented from taking place.

When compared with the rupture disk 22 of the pressure release device 2a of the first embodiment, the working pressure Pop of the second embodiment is adjustable according to the modulus of elasticity of the spring 25 of the pressure release device 2b.

While the pressure in the hermetically sealed tank 12 of the first embodiment falls to the atmospheric pressure after a pressure release operation, the pressure in the hermetically sealed tank 12 of the second embodiment is held to the pressure level of the initial filling pressure. Thus, the electric insulation of the hermetically sealed tank 12 is likely to be secured after a pressure release operation.

On the other hand, it is difficult for the minimum flow channel cross-sectional area SV of the gap 211 of the pressure release device 2b of the second embodiment that is produced in a pressure release operation to be made large when compared with the minimum flow channel cross-sectional area SD of the pressure release device 2a of the first embodiment shown in FIG. 3. For this reason, the second embodiment is suitable for applications where the average effective value Ia of the arc current, the arc ignition time Ta, the tank volume VT of the gas compartment where an arc occurs and so on are relatively small.

With the second embodiment, the pressure release device 2b automatically starts a pressure release operation when the pressure in the target gas compartment 111 of the hermetically sealed tank 12 rises above the working pressure Pop in a situation where the pressure of the insulating gas 15 is raised by the internal arc to give rise to an abnormal situation. In other words, the mouth of flow channel 21 of the pressure release device 2b is shifted from a closed state to an open state. Additionally, when the pressure in the target gas compartment 111 of the hermetically sealed tank 12 exceeds the working pressure Pop once and then falls below the pressure level, the valve body 24 is shifted from a state where it keeps the mouth of flow channel 21 open as shown in FIG. 7 to a state where it holds the mouth of flow channel 21 closed as shown in FIG. 6. In short, the pressure release device 2b can switch a state where the mouth of flow channel 21 is held open to a state where the mouth of flow channel 21 is kept closed and vice versa according to the pressure in the target gas compartment 111 of the hermetically sealed tank 12.

In an instance where $CO_2$ gas, $N_2$ gas or a mixture gas containing them as main components is employed as insulating gas 15, the second embodiment can safely execute a pressure release operation when the abnormal condition takes place due to the internal arc to raise the pressure in the hermetically sealed tank 12. Then, as a result, the hermetically sealed tank 12 is not required to have an excessively large capacity and/or an excessively stout structure. In other words, the space of installation and the manufacturing cost can be reduced among others. Additionally, since a valve body and a spring are employed in the pressure release device 2b of the second embodiment and do not require replacements after an occurrence of the abnormal condition, the servicing cost of the second embodiment can be reduced.

As described above, the second embodiment makes it possible to provide gas insulated electrical equipment that is very friendly to the environment, highly safe and economically advantageous.

Third Embodiment

Figure 8:
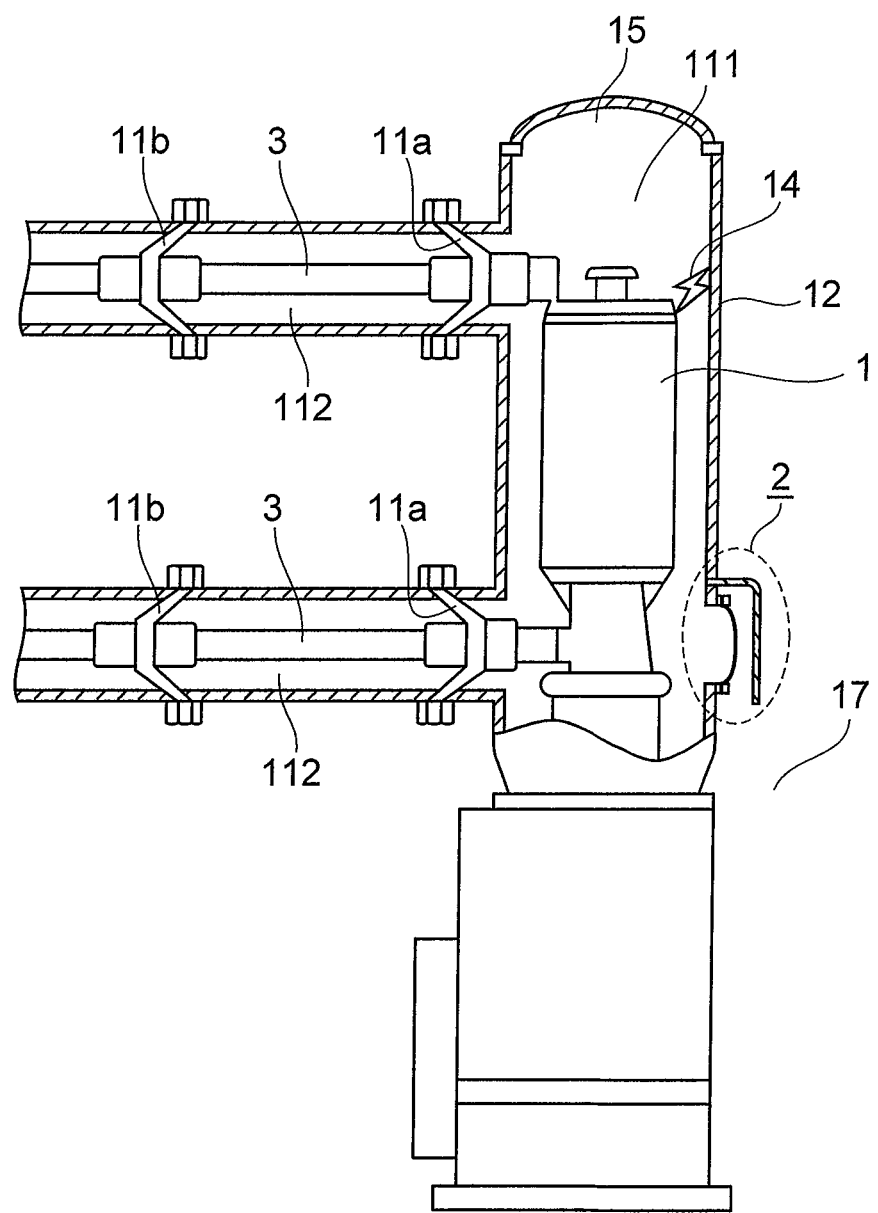
FIG. 8 is a schematic longitudinal cross-sectional view of a gas insulated electrical equipment according to the third embodiment of the present invention.

FIG. 8 is a schematic longitudinal cross-sectional view of a gas insulated electrical equipment according to the third embodiment. The basic configuration of the gas insulated electrical equipment of the third embodiment is the same as that of the first embodiment and that of the second embodiment. However, the third embodiment differs from the first and second embodiments as pointed out below.

In the instance illustrated in FIG. 8, a gas compartment 112 is neighboring the target gas compartment 111 and an insulating spacer 11a is arranged between the target gas compartment 111 and the neighboring gas compartment 112 and has such withstanding pressure lower than the withstanding pressure of the hermetically sealed tank 12, and the insulating spacer 11a ruptures when the pressure applied to it exceeds the working pressure Pop of the pressure release device 2.

An insulating spacer 11b is arranged between the neighboring gas compartment 112 and another gas compartment that is neighboring the neighboring gas compartment 112 and has such withstanding pressure lower than the withstanding pressure of the hermetically sealed tank 12 and higher than the withstanding pressure of the insulating spacer 11a.

Assume that the minimum flow channel cross-sectional area that is the area of the cross section that is perpendicular to the flow direction of the insulating gas 15 in the mouth of flow channel 21 is SD, the working pressure at which the pressure release device 2 starts operating is Pop. Also assume that, with regard to the arc 14 that occurs in the inside of the hermetically sealed tank 12, the average effective value of the arc current that is an estimation value is Ia, the arc ignition time that is also an estimation value is Ta, while the volume of the target gas compartment 111 is VT, the volume of the neighboring gas compartment 112 is Vn and the withstanding pressure of the insulating spacers 11b other than the insulating spacer 11a arranged at the target gas compartment 111 is PD and the constant indicating the efficiency of arc energy that contributes to the rise of pressure is α, the first constant and the second constant that respectively define the pressure rising characteristics of the insulating gas and the pressure release characteristics of the insulating gas being Kga and Kgb, the equation of $Kc=Kga \times Ia^{\alpha}/(VT+Vn)$ being made to hold true.

Then, SD and Pop of the pressure release device 2 are found within the range that satisfies the requirements of conditional formula shown below:

$$SD > (VT+Vn)/\{Kgb \times \log((Kc \times Ta-Pop)/(Kc \times Ta-PD))\} \quad \text{(Formula 3)}.$$

Then, as a result, the insulating spacer 11a that is arranged at the target gas compartment 111 of the hermetically sealed tank 12 does not rupture in an ordinary condition where the pressure in the target gas compartment 111 does not exceed the working pressure Pop but ruptures in an abnormal condition where the pressure in the target gas compartment 111 exceeds the working pressure Pop. On the other hand, the insulating spacer 11b has withstanding pressure that is lower than the withstanding pressure of the hermetically sealed tank 12 and higher than withstanding pressure of the insulating spacer 11a and hence does not rupture in the abnormal condition unless the pressure applied significantly exceeds the working pressure Pop.

Therefore, the insulating spacer 11a is damaged and broken when the internal arc occurs and the pressure in the target gas compartment 111 exceeds the withstanding pressure (permissible pressure) of the insulating spacer 11a in the gas insulated electrical equipment of the third embodiment. After the insulating spacer 11a is broken, the gas compartment formed by adding the target gas compartment 111 and the neighboring gas compartment 112 becomes a new target gas compartment.

With the instance of the third embodiment, when the initial volume VT of the target gas compartment 111 before an arc 14 occurs is small and it is difficult to realize an arrangement that satisfies the requirements of Formula 1, the volume VT can be increased to (VT+Vn) in effect to suppress the pressure rise in the abnormal condition at the cost of breakage of the insulating spacer 11a. Additionally, the pressure release device 2 can operate to release pressure so as to make the pressure do not rise above the withstanding pressure PD. Then, although hot and high pressure gas is released into the atmosphere, the pressure rise in the abnormal condition is alleviated to reduce the risk of destroying the hermetically sealed tank 12 and occurrences of other hazardous accidents in the surroundings because the volume (VT+Vn) of the gas compartment that is sacrificed to arc in the hermetically sealed tank 12 is increased in effect.

The insulating spacer 11b arranged between the neighboring gas compartment 112 and the gas compartment that is neighboring the neighboring gas compartment 112 may be replaced by an insulating spacer 11a. When the insulating spacer 11a arranged there is broken, the total volume obtained by adding the volume VT of the target gas compartment 111, the volume Vn of the neighboring gas compartment 112 and the volume of the gas compartment that is neighboring the neighboring gas compartment 112 corresponds to VT in the above-described Formula 1.

Thus, the volume that corresponds to VT in the above-described Formula 1 can be increased in effect by arranging insulating spacers 11a in two or more gas compartments.

As described above, the third embodiment is characterized in that a plurality of neighboring gas compartments are provided by arranging an insulating spacer 11a or insulating spacer 11b in each of a plurality of gas compartments. With this arrangement, the volume of a gas compartment that can be a target of occurrence of an arc in the hermetically sealed tank 12 can be increased when the volume of the gas compartment that can be a target of occurrence of an arc (the initial target gas compartment 111) cannot be increased or when the withstanding pressure thereof cannot be raised for structural reasons.

As described above, the third embodiment makes it possible to provide a gas insulated electrical equipment that is very friendly to the environment, highly safe and economically advantageous.

Note that the neighboring gas compartment 112 may be not a simple single phase busbar but a sort of gas insulated switchgear such as a circuit breaker.

Other Embodiments

When a gas insulated electrical equipment according to the present invention can be designed when the minimum flow channel cross-sectional area SD of pressure release device in Formula 1 is not greater than 0, it may not be provided with any pressure release device 2. Such an arrangement constitutes a modification to the third embodiment. When there are restrictions and/or regulations that prohibit a hermetically sealed tank from releasing insulating gas into the atmosphere, a gas insulated electrical equipment according to the present invention cannot be provided with any pressure release device 2. When such is the case, the third embodiment may be modified to adapt itself to such restrictions and/or regulations by specifying the withstanding pressure of the insulating spacers 11a in a manner as described above for the third embodiment and not providing a pressure release device 2. Then, as described above, a sufficient volume can be secured for the target gas compartment in effect when the internal arc occurs.

While certain embodiments have been described, these embodiments have been presented by way of example only, and are not intended to limit the scope of the inventions. For example, the present invention is applicable not only to a gas insulated electrical equipment but also to devices using insulating gas. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A gas insulated electrical equipment comprising:
a high-voltage conductor to be electrically charged;
a hermetically sealed container to be filled with insulating gas;
one or more insulating spacers for dividing the hermetically sealed container into a plurality of gas compartments and supporting the high-voltage conductor, keeping insulation between the high-voltage conductor and the hermetically sealed container; and
a pressure release device equipped with a mouth of flow channel adapted to allow the inside and the outside of the hermetically sealed container to communicate with each other so as to hermetically seal the hermetically sealed container by closing the mouth of flow channel and release the pressure in the hermetically sealed container by opening the mouth of flow channel, wherein
provided that the minimum flow channel cross-sectional area that is the area of the cross section that is perpendicular to the flow direction of the insulating gas in the mouth of flow channel is SD, the working pressure at which the pressure release device starts operating is Pop, and with regard to the arc that occurs in the inside of the hermetically sealed container, the average effective value of the arc current that is an estimation value is Ia and the arc ignition time that is also an estimation value is Ta, while the volume of the gas compartment that can be a target of occurrence of the arc is VT and the withstanding pressure of the insulating spacer is PD and the constant indicating the efficiency of arc energy that contributes to the rise of pressure is $\alpha$, the first constant and the second constant that respectively define the pressure rising characteristics of the insulating gas and the pressure release characteristics of the insulating gas being Kga and Kgb and that the equation of $Kc=Kga \times Ia^{\alpha}/VT$ is made to hold true;
SD is found within the range satisfying the requirements of conditional formula of $$SD > VT/\{Kgb \times \log((Kc \times Ta - Pop)/(Kc \times Ta - PD))\}; \text{ and}$$

the pressure release device is so designed as to hermetically seal the hermetically sealed container and maintain the hermetically sealed state in an ordinary condition where the pressure in the gas compartment that can be a target of occurrence of the arc does not exceed the working pressure but release the pressure in the hermetically sealed container in an abnormal condition where the pressure in the gas compartment that can be a target of occurrence of the arc exceeds the working pressure.

2. The gas insulated electrical equipment according to claim 1, wherein:
the pressure release device has a rupture disk covering the mouth of flow channel of the hermetically sealed container; and
the rupture disk has withstanding pressure lower than the insulating spacer arranged at the gas compartment that can be a target of occurrence of the arc but ruptures in the abnormal condition.

3. The gas insulated electrical equipment according to claim 1, wherein:
the pressure release device has a valve body for closing the mouth of flow channel and a resilient body for urging the valve body toward the side of closing the mouth of flow channel; and
the valve body closes the mouth of flow channel by the urging force of the resilient body in the ordinary condition but the resilient body is compressed and moved to a position where the valve body opens the mouth of flow channel in the abnormal condition.

4. The gas insulated electrical equipment according to claim 1, wherein
the pressure release device has a protection cover arranged at the outside of the hermetically sealed container to change the direction in which the insulating gas bursts out in an instance where the pressure in the hermetically sealed container is released.

5. The gas insulated electrical equipment according to claim 1, wherein
the insulating spacer arranged at the gas compartment that can be a target of occurrence of the arc in the inside of the hermetically sealed container of the plurality of insulating spacers for dividing the hermetically sealed container into a plurality of gas compartments is made to have withstanding pressure lower than the withstanding pressure of the hermetically sealed container and, provided that the minimum flow channel cross-sectional area that is the area of the cross section that is perpendicular to the flow direction of the insulating gas in the insulating spacer arranged at a gas compartment that can be a target of the arc in the inside of the hermetically sealed container is SDb, the withstanding pressure of the insulating spacer other than the insulating spacer arranged at the gas compartment that can be a target of occurrence of the arc is PDb and the volume of the gas compartment neighboring the gas compartment that can be a target of occurrence of the arc is Vn and that the equation of $Kcb = Kga \times Ia^{\alpha}/(VT+Vn)$ is made to hold true;
SDb is found within the range satisfying the requirements of conditional formula of $$SDb > (VT+Vn)/\{Kgb \times \log((Kcb \times Ta - Pop)/(Kcb \times Ta - PDb))\}; \text{ and}$$

the insulating spacer is so designed as not to rupture in the ordinary condition where the pressure in the gas compartment that can be a target of occurrence of the arc does not exceed the working pressure but ruptures in the abnormal condition where the pressure in the gas compartment that can be a target of occurrence of the arc exceeds the working pressure.

6. The gas insulated electrical equipment according to claim 1, wherein
the insulating gas is $N_2$ gas, $CO_2$ gas, a mixture gas containing $N_2$ gas as main component or a mixture gas containing $CO_2$ gas as main component.

7. The gas insulated electrical equipment according to claim 1, wherein
the hermetically sealed container is a tank formed by welding rolled plates.

8. The gas insulated electrical equipment according to claim 2, wherein:
the pressure release device has a protection cover arranged at the outside of the hermetically sealed container to change the direction in which the insulating gas bursts out in an instance where the pressure in the hermetically sealed container is released.

9. The gas insulated electrical equipment according to claim 2, wherein
the insulating spacer arranged at the gas compartment that can be a target of occurrence of the arc in the inside of the hermetically sealed container of the plurality of insulating spacers for dividing the hermetically sealed container into a plurality of gas compartments is made to have withstanding pressure lower than the withstanding pressure of the hermetically sealed container and, provided that the minimum flow channel cross-sectional area that is the area of the cross section that is perpendicular to the flow direction of the insulating gas in the insulating spacer arranged at a gas compartment that can be a target of the arc in the inside of the hermetically sealed container is SDb, the withstanding pressure of the insulating spacer other than the insulating spacer arranged at the gas compartment that can be a target of occurrence of the arc is PDb and the volume of the gas compartment neighboring the gas compartment that can be a target of occurrence of the arc is Vn and that the equation of $Kcb = Kga \times Ia^{\alpha}/(VT+Vn)$ is made to hold true;
SDb is found within the range satisfying the requirements of conditional formula of $$SDb > (VT+Vn)/\{Kgb \times \log((Kcb \times Ta - Pop)/(Kcb \times Ta - PDb))\}; \text{ and}$$

the insulating spacer is so designed as not to rupture in the ordinary condition where the pressure in the gas compartment that can be a target of occurrence of the arc does not exceed the working pressure but ruptures in the abnormal condition where the pressure in the gas compartment that can be a target of occurrence of the arc exceeds the working pressure.

10. The gas insulated electrical equipment according to claim 2, wherein
the insulating gas is $N_2$ gas, $CO_2$ gas, a mixture gas containing $N_2$ gas as main component or a mixture gas containing $CO_2$ gas as main component.

11. The gas insulated electrical equipment according to claim 2, wherein
the hermetically sealed container is a tank formed by welding rolled plates.

12. The gas insulated electrical equipment according to claim 3, wherein:
the pressure release device has a protection cover arranged at the outside of the hermetically sealed container to change the direction in which the insulating gas bursts out in an instance where the pressure in the hermetically sealed container is released.

13. The gas insulated electrical equipment according to claim 3, wherein the insulating spacer arranged at the gas compartment that can be a target of occurrence of the arc in the inside of the hermetically sealed container of the plurality of insulating spacers for dividing the hermetically sealed container into a plurality of gas compartments is made to have withstanding pressure lower than the withstanding pressure of the hermetically sealed container and, provided that the minimum flow channel cross-sectional area that is the area of the cross section that is perpendicular to the flow direction of the insulating gas in the insulating spacer arranged at a gas compartment that can be a target of the arc in the inside of the hermetically sealed container is SDb, the withstanding pressure of the insulating spacer other than the insulating spacer arranged at the gas compartment that can be a target of occurrence of the arc is PDb and the volume of the gas compartment neighboring the gas compartment that can be a target of occurrence of the arc is Vn and that the equation of $Kcb=Kga \times Ia^{\alpha}(VT+Vn)$ is made to hold true;

SDb is found within the range satisfying the requirements of conditional formula of $$SDb > (VT+Vn)/\{Kgb \times \log((Kcb \times Ta-Pop)/(Kcb \times Ta-PDb))\}; \text{ and}$$

the insulating spacer is so designed as not to rupture in the ordinary condition where the pressure in the gas compartment that can be a target of occurrence of the arc does not exceed the working pressure but ruptures in the abnormal condition where the pressure in the gas compartment that can be a target of occurrence of the arc exceeds the working pressure.

14. The gas insulated electrical equipment according to claim 3, wherein the insulating gas is $N_2$ gas, $CO_2$ gas, a mixture gas containing $N_2$ gas as main component or a mixture gas containing $CO_2$ gas as main component.

15. The gas insulated electrical equipment according to claim 3, wherein the hermetically sealed container is a tank formed by welding rolled plates.

16. A gas insulated electrical equipment comprising:

a high-voltage conductor to be electrically charged;

a hermetically sealed container to be filled with insulating gas;

one or more than one insulating spacers for dividing the hermetically sealed container into a plurality of gas compartments and supporting the high-voltage conductor, keeping insulation between the high-voltage conductor and the hermetically sealed container; and a pressure release device equipped with a mouth of flow channel adapted to allow the inside and the outside of the hermetically sealed container to communicate with each other so as to hermetically seal the hermetically sealed container by closing the mouth of flow channel and release the pressure in the hermetically sealed container by opening the mouth of flow channel, wherein the insulating spacer arranged at the gas compartment that can be a target of occurrence of an arc in the inside of the hermetically sealed container of the plurality of insulating spacers for dividing the hermetically sealed container into a plurality of gas compartments is made to have withstanding pressure lower than the withstanding pressure of the hermetically sealed container, provided that the minimum flow channel cross-sectional area that is the area of the cross section that is perpendicular to the flow direction of the insulating gas in the mouth of flow channel is SD, the working pressure at which the pressure release devices starts operating is Pop, and with regard to the arc that occurs in the inside of the hermetically sealed container, the average effective value of the arc current that is an estimation value is Ia and the arc ignition time that is also an estimation value is Ta, while the volume of the gas compartment that can be a target of occurrence of the arc is VT, the volume of the gas compartment neighboring the gas compartment that can be a target of occurrence of the arc is Vn, the withstanding pressure of the insulating spacer other than the insulating spacer arranged at the gas compartment that can be a target of occurrence of the arc is PD and the constant indicating the efficiency of arc energy that contributes to the rise of pressure is α, the first constant and the second constant that respectively define the pressure rising characteristics of the insulating gas and the pressure release characteristics of the insulating gas being Kga and Kgb and that the equation of $Kc=Kga \times Ia^{\alpha}/(VT+Vn)$ is made to hold. true;

SD is found within the range satisfying the requirements of conditional formula of $$SD > (VT+Vn)/\{Kgb \times \log((Kc \times Ta-Pop)/(Kc \times Ta-PD))\}; \text{ and}$$

the insulating spacer is so designed as not to rupture in an ordinary condition where the pressure in the gas compartment that can be a target of occurrence of the arc does not exceed the working pressure but ruptures in an abnormal condition where the pressure in the gas compartment that can be a target of occurrence of the arc exceeds the working pressure.

17. The gas insulated electrical equipment according to claim 16, wherein the insulating gas is $N_2$ gas, $CO_2$ gas, a mixture gas containing $N_2$ gas as main component or a mixture gas containing $CO_2$ gas as main component.

18. The gas insulated electrical equipment according to claim 16, wherein the hermetically sealed container is a tank formed by welding rolled plates.

* * * * *